United States Patent
Isaacs et al.

[11] Patent Number: 6,127,204
[45] Date of Patent: Oct. 3, 2000

[54] COLUMN GRID ARRAY OR BALL GRID ARRAY PAD ON VIA

[75] Inventors: Phillip Duane Isaacs, Rochester; Miles Frank Swain, Hayfield; Connie Jean Mathison, Pine Island, all of Minn.

[73] Assignee: International Business Machines Corporation, Armonk, N.Y.

[21] Appl. No.: 09/111,312

[22] Filed: Jul. 7, 1998

Related U.S. Application Data

[62] Division of application No. 08/782,860, Jan. 13, 1997, which is a continuation of application No. 08/364,790, Dec. 27, 1994.

[51] Int. Cl.$^7$ ............................ H01L 21/44; H01L 21/48; H01L 21/50
[52] U.S. Cl. ............................ 438/106; 438/64; 438/106; 438/108; 257/737; 257/738; 257/773; 257/774; 257/778; 257/697
[58] Field of Search ..................................... 257/772, 774, 257/738, 737, 773, 777, 778, 697; 438/640, 64, 106, 108

[56] References Cited

U.S. PATENT DOCUMENTS

| | | | |
|---|---|---|---|
| 4,617,730 | 10/1986 | Geldermans et al. | 29/843 |
| 4,664,309 | 5/1987 | Allen et al. | 228/180.22 |
| 4,787,853 | 11/1988 | Igarashi | 439/55 |
| 4,866,841 | 9/1989 | Hubbard | 29/845 |
| 4,914,814 | 4/1990 | Behun et al. | 29/843 |
| 4,996,391 | 2/1991 | Schmidt | 174/255 |
| 5,118,027 | 6/1992 | Braun et al. | 228/180.22 |
| 5,177,670 | 1/1993 | Shinohara et al. | 361/738 |
| 5,386,627 | 2/1995 | Booth et al. | 29/852 |
| 5,406,701 | 4/1995 | Pepe et al. | 29/840 |
| 5,485,039 | 1/1996 | Fujita et al. | 257/774 |
| 5,486,723 | 1/1996 | Ma et al. | 257/707 |
| 6,011,693 | 1/2000 | Gore | 361/760 |

FOREIGN PATENT DOCUMENTS

| | | |
|---|---|---|
| 60-97656 | 5/1985 | Japan . |
| 2-248066 | 10/1990 | Japan . |
| 3-257989 | 11/1991 | Japan . |

OTHER PUBLICATIONS

"Subsurface Solder I C Module Pin", *IBM Technical Disclosure Bulletin*, 28(6):2603–2604 (Nov. 1985).

"Flip Chip Attach with Solder Bump on Carrier Via Hole", *IBM Technical Disclosure Bulletin*, 37(06B):159 (Jun. 1994).

Lau, J.H., Ball Grid array Technology, McGraw–Hill Book Company, New York, N.Y., 1995, pp. 23–25.

*Primary Examiner*—David Hardy
*Assistant Examiner*—José R. Diaz
*Attorney, Agent, or Firm*—Jerome R. Smith, Jr.; Roy W. Truelson

[57] ABSTRACT

A electronic apparatus and a process for its manufacture are disclosed. The apparatus includes a planar card for accommodating an electronics module package having protruding solder columns and solder joints to mechanically mount and electrically connect the solder columns of the module to the planar card. The planar card includes a first side and a second side, a plurality of wiring lines forming a wiring pattern, and a plurality of vias extending at least partially through the card. Each of the vias includes at least one recessed area extending from one or both sides of the card. The recessed areas extending to a depth within the planar card sufficient to wick the solder joints, and the each of the recessed areas are shaped to provide surface tension to mechanically retain the solder joints.

15 Claims, 3 Drawing Sheets

COLUMN GRID ARRAY OR BALL GRID ARRAY PAD ON VIA

This application is a Divisional of application Ser. No. 08/782,860, filed Jan. 13, 1997, which is a continuation of Ser. No. 08/364,790, filed Dec. 27, 1994, which applications are incorporated herein by reference.

FIELD OF THE INVENTION

This invention relates generally to surface mount technology in the electronic packaging area. More particularly, this invention relates to an apparatus and a method for attaching an electronic module package to a planar card, such as a printed circuit board, resulting in increased circuit density (connections per area) and increased package reliability.

BACKGROUND OF THE INVENTION

Conventional methods of mounting electronic module packages ("modules") on printed circuit boards have been achieved with pin grid arrays (PGAs). Typical PGAs are used for mounting devices with large numbers of pins into printed circuit boards.

The prior art PGAs generally included a module having rigid pins extending through the plated through holes in the printed circuit boards. These pins are mounted in these plated through holes with conventional solder, which forms a solder fillet having a very high angle.

This PGA exhibits several drawbacks. A major drawback is the limitation on the lead density, as the plated through holes must be of a sufficiently large diameter (approximately 0.102 cm) to receive the large diameter pins. As a result, these openings occupy space on the printed circuit board which limits the number of possible electrical (pin-plated through hole) connections, or circuit density, as commonly referred to in the art. Additionally, solder of the solder joint, which attaches and electrically connects the pins to their respective plated through holes, forms solder fillets, that extend a substantial distance upward along the pins at high angles. This structure produces high stress in the rigid pins and substantially negates the ability of the pins to bend, in response to thermal and other stresses. As a result, the pins and solder joints are subjected to high sheer strains, increasing the likelihood of breakage of the connection between the chip and the printed circuit board, potentially shortening the useful life of the electronic device employing the printed circuit board.

Additional prior art PGAs, that improve on those discussed above, include printed circuit boards having enlarged openings at the ends of the plated non-through holes, on the top side of the printed circuit boards. These enlarged openings receive rigid pins. The pins are soldered in the openings leaving solder fillets of very high angles. The bottom side of the printed circuit board includes multiple terminals designed to accommodate wiring to compensate for the space lost by the large pin and hole diameters (approximately 1 mm) on the top (pin-receiving) side of the printed circuit board.

This device exhibits the drawbacks discussed above with respect to the high stress and breakage problems associated with the solder fillets. Additionally the large pin and hole diameters restrict the wiring to a single (bottom) side, thus limiting the amount of possible electrical connections.

Surface mount technology has also been employed with printed circuit boards. Surface mount technology has gained acceptance as the preferred means of joining electronic devices together, particularly in high-end computers. As compared to more traditional pin connector methods, like the above discussed PGAs, where a pin mounted to the backside of a ceramic module is thrust through a hole in the board, twice the number of modules can be placed at the same board area. Other advantages such as smaller component sizes, greater I/O densities, lower electrical resistance, decreased costs, and shorter signal paths have prompted the industry migration to surface mount technology.

Conventional surface mount technology involves Column Grid Arrays (CGAs) or Ball Grid Arrays (BGAs), which mount to pads, which are in turn connected to vias. CGAs are integrated circuit chips or modules which have a rectangular matrix of contacts for a substrate, such as a printed circuit board or the like. The contacts are cylindrical columns of solder each having one end bonded to the chip or carrier module. BGAs differ from CGAs in that they include approximately spherical shaped solder balls instead of the cylindrical columns. An example of a CGA using conventional surface mount technology is illustrated in FIGS. 1 and 2 labeled "PRIOR ART".

FIG. 1 shows the CGA surface mount pad arrangement on the printed circuit board 20 with the module 22 (FIG. 2) removed. The top surface of the printed circuit board 20 includes a via (plated through hole) 24 which receives a solder column 26 (FIG. 2) from the module 22 (FIG. 2). A circuit wire 28, extending from the via 24, electrically connects the via 24 to a surface mount pad 30. This connection is commonly referred to as a "dog bone" pattern based on its shape.

FIG. 2 shows the mounting of the module 22 to the printed circuit board 20 in detail. Solder columns 26 extend from the module 22, and are connected to their respective surface mount pads 30, by solder joints 32 having solder fillets 34 against the solder columns 26. Through the circuit wires 28 (FIG. 1), electrical contacts are made with the vias 24.

This surface mount technology improved on the PGA technology. By using flexible solder columns with lower angled solder fillets, the printed circuit boards have longer usable lives. The chances for stress decrease as the flexible solder columns and solder fillets are able to accommodate the thermal expansion and contraction associated with this CGA technology. However, this prior art CGA exhibits a major drawback in that the "dog bones" and mounting pads occupy significant surface area of the printed circuit board, limiting circuit density. To bring the "dog bone" arrangements closer together to increase density is problematic, in that unwanted electrical shorts may occur should the components of these "dog bone" patterns accidentally come into contact with each other.

SUMMARY OF THE INVENTION

The present invention improves on these prior art technologies through the provision of recessed areas having small diameters on a planar card which directly attach to flexible solder columns protruding from an electronics module package ("module"). The small diameter recessed areas and direct connections use less surface area of the planar card and as such provide increased circuit density and allow for wiring on both sides of the planar card.

The invention comprises a planar card for accommodating an electronics module package having protruding solder columns and solder joints to mechanically mount and electrically connect the solder columns of the module to the planar card. The planar card includes a upper side and a lower side, a plurality of wiring lines forming a wiring pattern, and a plurality of vias extending at least partially through the card. Each of the vias includes at least one recessed area extending from one or both sides of the card. The recessed areas extend to a depth within the planar card sufficient to wick the solder joints, and the each of the recessed areas are shaped to provide surface tension to mechanically retain the solder joints. A process for manufacturing the invention is also disclosed.

BRIEF DESCRIPTION OF THE DRAWINGS

The present invention will be described with reference to the accompanying drawings, wherein like reference numerals identify corresponding or like components.

In the drawings.

DETAILED DESCRIPTION OF THE DRAWINGS

Figure 1:
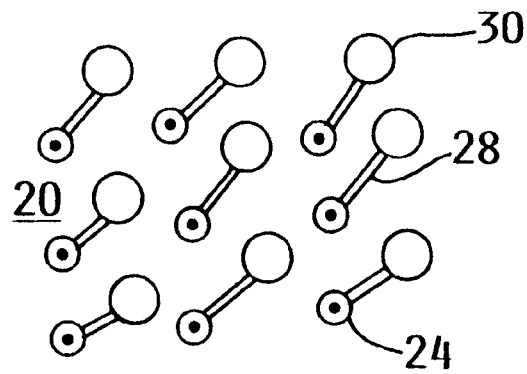
FIG. 1 is a top view of a printed circuit board of the prior art with the module removed.
Figure 2:
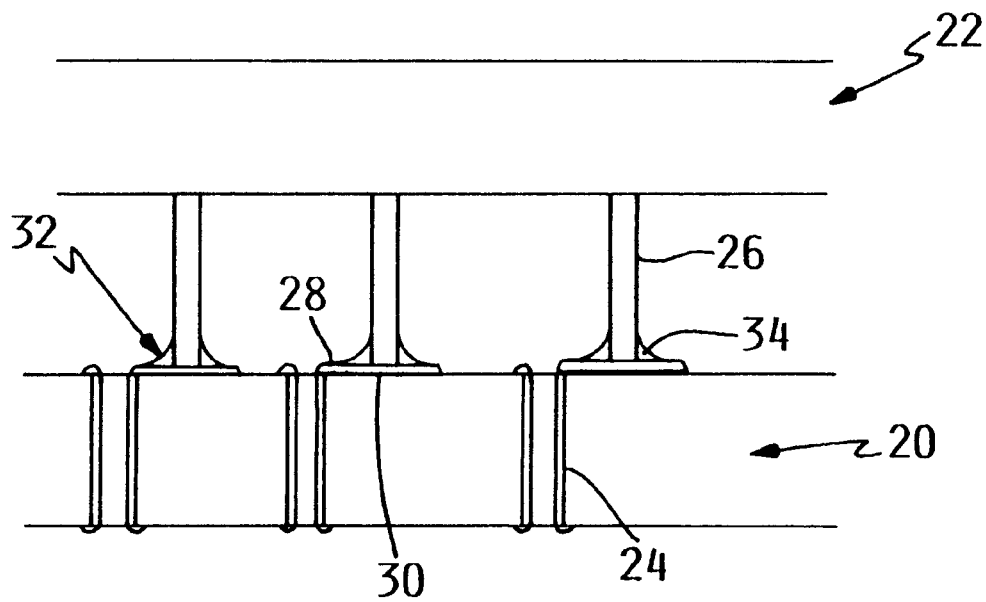
FIG. 2 is a cross sectional side view of the of the prior art.

FIGS. 1 and 2 detail the prior art and have been discussed above.

Figure 3:
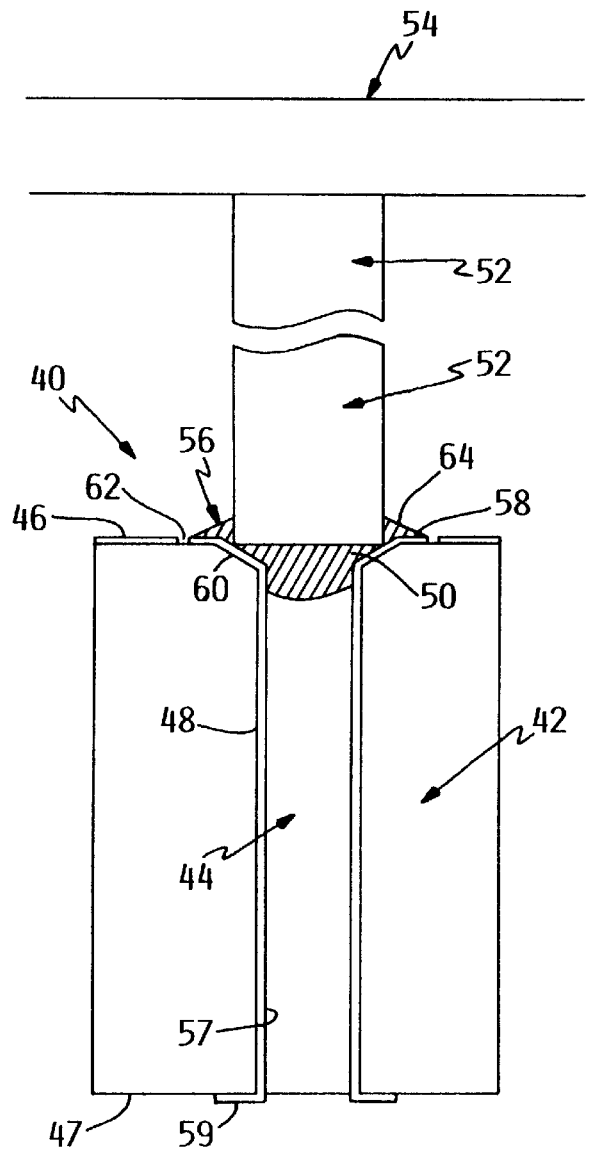
FIG. 3 is a cross sectional side view of the present invention.
Figure 4:
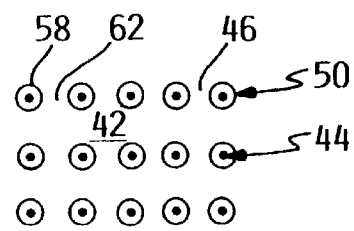
FIG. 4 is a top view of a planar card of the present invention with the module removed.

FIGS. 3 and 4 show the electronic apparatus 40 of the present invention. The apparatus 40 includes a planar card 42, preferably a multilayer printed circuit board or the like (a single layer printed circuit board is also permissible), with a via 44 (plated through hole), preferably extending through the planar card 42, from the upper side 46, to the lower side 47. The via 44 includes a body 48 and terminates in a recessed area 50 (depression) at the upper side 46. A solder column 52, extending from an electronics module package ("module") 54, is received in the recessed area 50. A solder joint 56 mechanically mounts and electrically connects to a solder column 52 in the recessed area 50. While the module 54 illustrated is a CGA, it could also be a BGA provided that a solder ball is used instead of the solder column 52. While only a single solder column 52 is shown in a single via 44 on the planar card 42, this is for purposes of illustration only, as the apparatus of the invention 40 involves planar cards 42 having multiple vias 44 for accommodating a corresponding number of solder columns 52, or solder balls if a BGA is The via 44 includes a plated surface 57 along the inner walls, that preferably extends the entire length of the via 44, to the recessed area 50 and onto the upper side 46 of the planar card 42, and to the lower side 47 of the planar card 42, forming lands 58, 59 on the respective sides. Although this arrangement of lands 58, 59 on both sides of the planar card 42 is preferred, lands on one or both sides of the card are not required.

Alternately, the via 44 may be a "blind via." Blind vias do not extend entirely through the planar card 42. They may include the recessed area 50 and a portion of the via body 48, or the recessed areas 50 alone.

The plated surface 57 is of an electrically conducting metal such as copper or other suitable electrically conducting material. The plating is performed by conventional techniques, well known to those skilled in the planar card and printed circuit board art.

The recessed areas 50 of the via 44 include depressions extending from the surface formed by a side, preferably the upper side 46 of the planar card 42. Specifically, the recessed area 50 includes outwardly extending shoulders 60, that are frustoconical shaped, that have a dihedral angle of approximately 120 degrees.

This frustoconical shape, and shallow depth (approximately 0.1 mm to 0.2 mm) into the planar card 42 of the recessed area 50, utilize surface tension on the molten solder composition (during reflow, as detailed below) to compete with the via 44 to retain the solder composition in a compact solder joint 56 as the solder composition cools. In other words, the recessed area 50 wicks the solder joint 56, keeping the solder composition on the plated surfaces 57 of the recessed areas 50, preventing the solder composition from spreading into the land to line spaces 62 between the vias 44 on the planar card 42. By inhibiting the spread of the solder composition of the solder joint 56, unwanted electrical contacts, which could damage the module 54 through shorts, are avoided.

Additionally, the shape and depth of the recessed area 50 allow the solder joint 56 to form solder fillets 64 having a low angle (approximately 10 degrees from the horizontal). These low angle solder fillets 64 maximize ductility between the solder joint 56 and the solder columns 52, to avoid stress fatigue embrittlement.

The solder joint 56 includes a solder composition of a standard flux in a eutectic mix (approximately 63% tin and 37% lead). Other solder compositions include a mixture of tin/bismuth or other solder alloys known to those skilled in the art.

The solder columns 52 on the module 54 (only one solder column 52 is shown in FIG. 3) are preferably compliant, in that they are capable of flexing to absorb stress built up between the via 44 and the module 54. This compliance is achieved in part by the solder columns 52 having a height approximately five times its width (or diameter). This height allows for an increased bending moment of the solder column 52, such that it can expand and contract at rates different than those for the module 54 to compensate for various stresses and strains at the solder joint 56. The solder columns 52 may be made of materials such as a mixture of approximately 90% tin and 10% lead, copper, KOVAR® (Carpenter Technology Corporation, Reading, Pennsylvania), or the like. The solder joints 56 and solder columns 52 of a single apparatus 40 may be of the same or different materials.

FIG. 4 shows the planar card 42. The recessed areas 50 provide a direct attachment of the solder columns 52 (FIG. 3) on the module 54 (FIG. 3), thus eliminating the need for surface mount pads 26 (FIGS. 1 and 2). Additionally, further space saving is achieved on the planar card 42 as the diameters of the recessed areas 50 are small (approximately 0.7 mm), and the diameters of the via bodies 48 are correspondingly small (approximately 0.3 mm). This allows for a high circuit density arrangement of connections, and permits wiring on both the upper side 46 and the lower side 47, and multiple internal signals and voltage planes on the planar card 42. The increase in circuit density achieved is typically four or more times greater than that of the prior art PGA's or surface mount technology.

Figure 5:
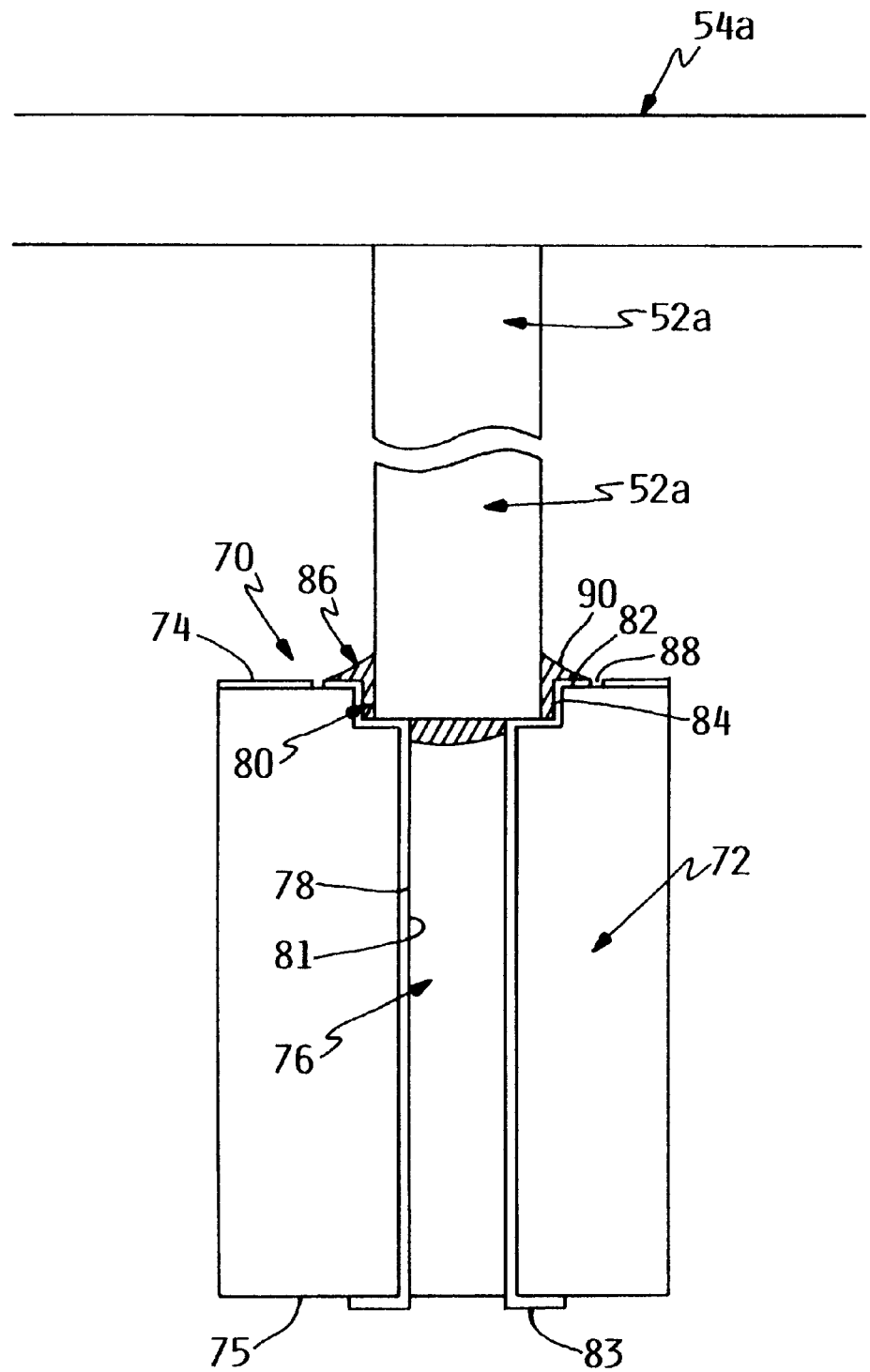
FIG. 5 is a cross sectional side view of a second embodiment of the present invention.

Turning now to FIG. 5, there is shown a second electronic apparatus 70 of the present invention. The electronic apparatus 70 is the same as the electronic apparatus 40 described in FIGS. 3 and 4 above, except as indicated below.

The apparatus 70 includes a planar card 72, similar to the planar card 42 discussed above in FIGS. 3 and 4. The planar card 72 has upper and lower sides 74, 75, and a via 76 extending between the sides 74, 75. The via 76 includes a body 78 and terminates in a cylindrically shaped recessed area 80, formed by a depression in the upper side 74 of the planar card 72. The via 76 may also be a "blind via" (discussed above).

A plated surface 81, similar to that described above, preferably extends the entire length of the via 76, to the recessed area 80 and onto the upper side 74 of the planar card 72, and to the lower side 75 of the planar card 72, forming lands 82, 83 on the respective sides. Although this arrangement of lands 82, 83 on both sides of the planar card 72 is preferred, lands on one or both sides of the planar card 72 are not required.

The recessed area 80 is formed by outwardly extending shoulders 84, that bend upward at approximately right angles toward the upper side 74 of the planar card 72. The recessed area 80 accommodates a solder column 52a that extends from a module 54a. A solder joint 86 mechanically mounts and electrically connects the solder column 52a in the recessed area 80 of the via 76. While only a single solder column 52a is shown in a single via 76 on the planar card 72, this is for purposes of illustration only, as the apparatus 70 of the invention involves planar cards 72 having multiple vias 76 for accommodating a corresponding number of solder columns 52a, or solder balls if a BGA is used.

The cylindrical shape and shallow depth (approximately 0.1 mm to 0.2 mm) of the recessed area 80 into the planar card 72, utilize surface tension on the molten solder composition (during reflow, as detailed below) to compete with the via 76 to retain the solder composition in a compact solder joint 86 as the solder composition cools. In other words, the recessed area 80 wicks the solder joint 86, keeping the solder composition on the plated surface 81 of recessed area 80, preventing the solder composition from spreading into the land to line spaces 88 between the vias 76 on the planar card 72. By inhibiting the spread of the solder composition of the solder joint 86, unwanted electrical contacts, which could damage the module 54a through shorts, are avoided.

Additionally, the shape and depth of the recessed area 80 allows the solder joint 86 to form solder fillets 90 having a low angle (less than ten degrees from the horizontal). These low angle solder fillets 90 maximize beam moment of solder columns 52a, which are compliant and serve to reduce stress fatigue on the solder joint 86 and the solder column 52a.

The electronic apparatus 40, 70 of the present invention are made by following preferred method. Initially, a planar card having vias or plated through holes, terminating in shallow recessed areas (depressions), is made by conventional printed circuit board fabrication techniques. A stencil, having openings with diameters corresponding the shallow recessed areas is placed over the planar card, such that the stencil openings are aligned with the recessed areas on the planar card. The stencil serves as a mask over the planar card.

Solder paste is then screened onto the planar card with a metal or rubber squeegee blade. The solder paste enters the aligned openings and recessed areas, subsequently filling them. Excess solder paste is removed at the same time from the stencil by moving the squeegee blade or the like over the upper surface of the stencil. Each of the recessed areas facilitates a larger volume of solder paste, to accommodate the solder requirements for both the solder joint and the solder column, which may be thieved by the via. Additionally, the use of the stencil allows for the solder paste to reach a certain thickness and volume which is approximately double or triple the normal solder volume into the recessed areas than would have been achieved without the recessed areas.

Once the screening step is complete, the stencil is removed. A module with solder columns, corresponding to the recessed areas, now filled with solder paste in the planar card, is joined to the planar card. The solder paste is then reflowed by processes well known to those skilled in the art. During the reflowing step, the recessed areas provide sufficient surface tension to maintain the molten solder between the solder columns of the module and the recessed areas. The reflowing step preferably occurs in a convection reflow oven, IR oven, vapor phase reflow machine or the like, in various atmospheres such as nitrogen, air or the like. Once the reflowing step is complete, the card is cooled.

While the invention has been described with reference to preferred embodiment, it will be understood by those skilled in the art that changes may be made without departing from the spirit and scope of the invention.

What is claimed is:

1. A method of mounting an electronics module on a planar card, comprising:

a) providing an electronics module having an array of solder protrusions from one surface thereof for forming electrical connections;

b) providing a planar card having vias and a wiring pattern, said planar card further having an array of shallow recessed areas for placement of said electronics module, wherein said shallow recessed areas each have a depth between 0 and 0.2 millimeters;

c) screening a solder paste onto the planar card, each of the recessed areas facilitating a high solder volume to accommodate the solder paste in the recessed areas as well as the solder paste that may flow into each of the vias;

d) holding the array of solder protrusions in contact with a corresponding array of shallow recessed areas formed in the card and electrically connected to the wiring pattern;

e) reflowing the solder paste to form an array of solder joints between the solder protrusions and the wiring pattern at the recessed areas, the solder joints being held in place by surface tension between the solder protrusions and the shallow recessed areas; and f) cooling the planar card to solidify the solder joints in place at the recessed areas with the module spaced above the planar card for movement in a direction parallel to the planar card during thermal cycling of the module.

2. The method of claim 1, wherein the solder paste is screened onto the planar card by;

a) placing a stencil including openings onto the planar card, the stencil openings in line with the recessed areas;

b) applying solder paste into the aligned stencil openings and recessed areas; and c) removing any excess solder paste from the stencil.

3. A method of mounting an electronics module on a planar card, comprising the steps of:

a) providing an electronics module including a plurality of solder protrusions, each protrusion for forming a respective electrical contact between an electrical conductor within said electronics module and a corresponding electrical conductor on a planar card;

b) providing a planar card having a first surface and a plurality of depressions extending from the first surface into the planar card, wherein the depressions each have a depth between 0 and about 0.2 millimeters;

c) aligning the solder protrusions with the depressions of the planar card; and d) forming a solder joint in each depression for securing the solder protrusion to the planar card and forming a plurality of electrical connections, each connection being through a respective one of said solder protrusions.

4. The method according to claim 3, further including placing a solder paste on the first surface of the planar card prior to aligning the column with the depression.

5. The method according to claim 4, wherein forming the solder joint includes flowing the solder paste.

6. The method according to claim 5, wherein forming the solder joint includes solidifying the solder joint after flowing the solder paste.

7. The method according to claim 3, wherein the depression is frustroconical.

8. The method according to claim 3, wherein the depression includes a side surface extending from the first surface of the planar card at an obtuse angle relative to the first surface of the planar card.

9. The method according to claim 3, wherein the depression is cylindrical.

10. The method according to claim 9, wherein the cylindrical depression includes a side surface extending at a right angle from the first surface of the planar card and a base surface extending at a right angle from the side surface of the depression.

11. The method according to claim 3, wherein providing the planar card includes providing a via extending from the depression toward a second surface of the card and aligning the column with the depression includes extending part of the column into the depression without extending the column into the via.

12. The method according to claim 3, wherein forming the solder joint includes forming a portion of the solder joint in a via beneath the column.

13. The method according to claim 3, wherein forming the solder joint includes forming at least a portion of the solder joint on the first surface with an upper surface angle between 0 degrees and 10 degrees.

14. The method according to claim 3, wherein the solder protrusions are cylindrical solder columns.

15. The method according to claim 3, wherein the solder protrusions are solder balls.

* * * * *